US 11,367,738 B2

(12) United States Patent
Nagao et al.

(10) Patent No.: US 11,367,738 B2
(45) Date of Patent: Jun. 21, 2022

(54) SEMICONDUCTOR DEVICE

(71) Applicant: ROHM CO., LTD., Kyoto (JP)

(72) Inventors: Katsuhisa Nagao, Kyoto (JP); Noriaki Kawamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 26 days.

(21) Appl. No.: 17/109,676

(22) Filed: Dec. 2, 2020

(65) Prior Publication Data

US 2021/0091117 A1    Mar. 25, 2021

Related U.S. Application Data

(60) Continuation of application No. 16/555,843, filed on Aug. 29, 2019, now Pat. No. 10,886,300, which is a
(Continued)

(30) Foreign Application Priority Data

Nov. 28, 2013  (JP) ................. 2013-246474

(51) Int. Cl.
*H01L 27/07*    (2006.01)
*H01L 27/118*   (2006.01)
(Continued)

(52) U.S. Cl.
CPC ...... *H01L 27/11898* (2013.01); *H01L 23/528* (2013.01); *H01L 27/11807* (2013.01);
(Continued)

(58) Field of Classification Search
CPC ............ H01L 27/0629; H01L 27/0727
See application file for complete search history.

(56) References Cited

U.S. PATENT DOCUMENTS 5,726,474 A    3/1998  Miller et al.
6,236,088 B1   5/2001  Nielson et al.
(Continued)

FOREIGN PATENT DOCUMENTS

EP    1205981     5/2002
JP    S6298670    5/1987
(Continued)

OTHER PUBLICATIONS

International Search Report issued for International Patent Application No. PCT/JP2014/081273, dated Feb. 3, 2015, 2 pages.
(Continued)

*Primary Examiner* — Jae Lee
(74) *Attorney, Agent, or Firm* — Hamre, Schumann, Mueller & Larson, P.C.

(57) ABSTRACT

A semiconductor device (1) is manufactured which includes a SiC epitaxial layer (28), a plurality of transistor cells (18) that are formed in the SiC epitaxial layer (28) and that are subjected to ON/OFF control by a predetermined control voltage, a gate electrode (19) that faces a channel region (32) of the transistor cells (18) in which a channel is formed when the semiconductor device (1) is in an ON state, a gate metal (44) that is exposed at the topmost surface for electrical connection with the outside and that is electrically connected to the gate electrode (19) while being physically separated from the gate electrode (19), and a built-in resistor (21) that is made of polysilicon and that is disposed below the gate metal (44) so as to electrically connect the gate metal (44) and the gate electrode (19) together.

20 Claims, 5 Drawing Sheets

Related U.S. Application Data continuation of application No. 15/883,690, filed on Jan. 30, 2018, now Pat. No. 10,438,971, which is a division of application No. 15/039,725, filed as application No. PCT/JP2014/081273 on Nov. 26, 2014, now Pat. No. 9,917,102.

(51) Int. Cl.

| | | |
|---|---|---|
| *H01L 29/16* | (2006.01) | |
| *H01L 29/739* | (2006.01) | |
| *H01L 29/423* | (2006.01) | |
| *H01L 29/78* | (2006.01) | |
| *H01L 23/528* | (2006.01) | |
| *H01L 29/06* | (2006.01) | |
| *H01L 29/10* | (2006.01) | |
| *H01L 23/532* | (2006.01) | |

(52) U.S. Cl.
CPC .... *H01L 27/11896* (2013.01); *H01L 29/1608* (2013.01); *H01L 29/42372* (2013.01); *H01L 29/7395* (2013.01); *H01L 29/7397* (2013.01); *H01L 29/7803* (2013.01); *H01L 29/7811* (2013.01); *H01L 29/7813* (2013.01); *H01L 23/53214* (2013.01); *H01L 23/53219* (2013.01); *H01L 23/53228* (2013.01); *H01L 23/53233* (2013.01); *H01L 29/0615* (2013.01); *H01L 29/0696* (2013.01); *H01L 29/1095* (2013.01); *H01L 29/4236* (2013.01); *H01L 29/4238* (2013.01); *H01L 29/78* (2013.01); *H01L 2027/11866* (2013.01)

(56) References Cited

U.S. PATENT DOCUMENTS

| | | | | |
|---|---|---|---|---|
| 2003/0127705 | A1* | 7/2003 | Kwak | H01L 27/10894 |
| | | | | 257/536 |
| 2005/0194660 | A1 | 9/2005 | Mochizuki et al. | |
| 2006/0113547 | A1* | 6/2006 | Shin | H01L 27/11531 |
| | | | | 257/77 |
| 2007/0018162 | A1 | 1/2007 | Song et al. | |
| 2007/0176295 | A1 | 8/2007 | Chinthakindi et al. | |
| 2008/0001646 | A1 | 1/2008 | Lui et al. | |
| 2010/0055858 | A1 | 3/2010 | Hayashi et al. | |
| 2010/0163922 | A1* | 7/2010 | Yoneda | H01L 27/0652 |
| | | | | 257/140 |
| 2010/0244146 | A1 | 9/2010 | Uno | |
| 2010/0301417 | A1 | 12/2010 | Cheng et al. | |
| 2012/0205669 | A1 | 8/2012 | Miura et al. | |
| 2013/0020587 | A1 | 1/2013 | Hino et al. | |
| 2015/0348783 | A1 | 12/2015 | Fukuda | |

FOREIGN PATENT DOCUMENTS

| | | |
|---|---|---|
| JP | S62224074 | 10/1987 |
| JP | H01305576 | 12/1989 |
| JP | H11312786 | 11/1999 |
| JP | 2000294770 | 10/2000 |
| JP | 2001250948 | 9/2001 |
| JP | 2002083964 | 3/2002 |
| JP | 2003197914 | 7/2003 |
| JP | 2008270492 | 11/2008 |
| JP | 2008294301 | 12/2008 |
| JP | 2009543324 | 12/2009 |
| JP | 2010016103 | 1/2010 |
| JP | 2010153636 | 7/2010 |
| JP | 2010238885 | 10/2010 |
| WO | 2011045834 | 4/2011 |

OTHER PUBLICATIONS

International Preliminary Report on Patentability issued for International Patent Application No. PCT/JP2014/081273, dated Jun. 9, 2016, 11 pages including English translation.

Extended European Search Report issued for corresponding European Patent Application No. 14865393.4, dated Jul. 11, 2017, 13 pages.

Office Action issued for Japanese Patent Application No. 2015-550968, dated Nov. 1, 2018, 9 pages including English translation.

Extended European Search Report issued for European Patent Application No. 19215868.1, dated Mar. 24, 2020, 8 pages.

Office Action issued for Japanese Patent Application No. 2019-138919, dated Jul. 30, 2020, 20 pages including English translation.

* cited by examiner

SEMICONDUCTOR DEVICE

TECHNICAL FIELD

The present invention relates to a SiC semiconductor device.

BACKGROUND ART

Patent Document 1 discloses a semiconductor device that includes a gate pad, a gate connection wiring made of polysilicon, and a gate metal wiring that is formed on the gate connection wiring and that is continuous integrally with the gate pad. When a voltage is applied to the gate pad, electric power is supplied to a MOSFET formed in an active region through the gate metal wiring and the gate connection wiring.

PRIOR ART DOCUMENTS

Patent Documents

Patent Document 1: Japanese Patent Application Publication No. 2010-238885

SUMMARY OF INVENTION

Technical Problem

Practically, there is a case in which a module having a plurality of semiconductor devices (chips) connected together in parallel is used. The module is provided with gate terminals that are collectively and electrically connected to a gate of each chip. A control voltage is applied to these gate terminals, and, as a result, a voltage is simultaneously applied to the gate of each built-in chip, so that a switching operation is performed.

However, in the thus arranged module, a problem resides in the fact that a noise is liable to occur when the module is in an ON state. This is caused by the fact that variations in gate resistance exist among a plurality of chips and the fact that an electric current concentrates on a chip having relatively low gate resistance in the beginning of ON-controlling. Additionally, variations in gate resistance are caused by variations in processing accuracy (etching size, etc.) when chips are manufactured, and therefore it is difficult to remove these variations.

On the other hand, it is permissible to provide each chip with external gate resistance that has a resistance value larger than the gate resistance in each chip, and yet another problem arises in the fact that the module becomes complicated in structure and it becomes difficult to perform the assembly of the parts.

Therefore, it is an object of the present invention to provide a semiconductor device that has a simple structure and that is capable of reducing the occurrence of a noise even if a plurality of semiconductor devices are connected together in parallel and are simultaneously used.

Solution to Problem

A first semiconductor device according to the present invention includes a SiC semiconductor layer, a plurality of cells that are formed in the SiC semiconductor layer and that are subjected to ON/OFF control by means of a predetermined control voltage, a control electrode that faces a channel region of the cells in which a channel is formed when turned on, a control pad that is exposed at a topmost surface for electric connection with an outside and that is physically separated from the control electrode and is electrically connected to the control electrode, and a built-in resistor that is disposed below the control pad and that is made of polysilicon electrically connecting the control pad and the control electrode together.

According to this arrangement, a polysilicon resistance (built-in resistor) is interposed between the control pad and the cell. In a resistance value (control resistance) obtained by totalizing the resistance value of the control electrode and the resistance value of the built-in resistor, it is possible to make the resistance value of the built-in resistor dominant by adjusting the resistance value of the built-in resistor. Therefore, even when a plurality of semiconductor devices among which a variation exists in the resistance value of the control electrode are used by being connected in parallel with each other, the resistance value of the built-in resistor is set to be larger than this variation, thus making it possible to limit the flow of an electric current into a semiconductor device in which the resistance value of the control electrode is relatively low. As a result, it is possible to reduce the occurrence of a noise when the semiconductor devices are used.

Moreover, polysilicon of which the built-in resistor is made is a material in which the resistance value can be easily controlled by, for example, the implantation of impurities, and its processing has been established by a conventional semiconductor manufacturing technique. Therefore, when the built-in resistor of the present invention is introduced, it is also possible to avoid the complication of the structure of the semiconductor device itself and of the structure of a module provided with this semiconductor device.

In one preferred embodiment of the present invention, the control pad is formed independently while a periphery of the control pad is surrounded by a space, and the built-in resistor is disposed in a region below the control pad with an interlayer film between the built-in resistor and the control pad.

According to this arrangement, it is possible to limit the flow-in of a gate current below the control pad, i.e., at an entrance portion of a current path that leads from the outside to the transistor cells. This makes it possible to prevent a rush current from flowing only to specific transistor cells. As a result, it is possible to reduce a variation in switching speed among the transistor cells.

The built-in resistor may be selectively disposed in a region below the control pad, and the interlayer film may be buried in a first region that is included in the region below the control pad and in which the built-in resistor is not disposed.

Preferably, in that case, the semiconductor device additionally includes an insulating film disposed between the built-in resistor and the SiC semiconductor layer, and a film made of an extension portion of the insulating film is disposed between the interlayer film and the SiC semiconductor layer in the first region.

According to this arrangement, it is possible to enlarge a distance between the SiC semiconductor layer and the control pad (i.e., the thickness of the insulating film) in the first region in which the built-in resistor is not disposed, and hence is possible to reduce the capacity therebetween.

In one preferred embodiment of the present invention, in the SiC semiconductor layer, an impurity region that has a concentration of $1 \times 10^{19}$ cm$^{-3}$ or less is selectively formed in a region facing the built-in resistor with the insulating film between the region and the built-in resistor.

According to this arrangement, the concentration of the impurity region facing the built-in resistor is $1\times10^{19}$ cm$^{-3}$ or less, and therefore it is possible to excellently restrain the insulation breakdown of the insulating film. Preferably, in that case, the SiC semiconductor layer is an n type SiC semiconductor layer, and the semiconductor layer has a p-type region of $1\times10^{19}$ cm$^{-3}$ or less in a region facing the built-in resistor with an insulating film therebetween. It is more difficult for the p-type region to store carriers than for the n type region, and therefore it is also possible to reduce the capacity between the built-in resistor and the p-type region, both of which face each other with the gate insulating film therebetween.

In one preferred embodiment of the present invention, a wire region to which a bonding wire is connected is selectively formed on a surface of the control pad, and the built-in resistor is selectively disposed in a region that avoids the wire region when planarly viewed from a normal direction of the SiC semiconductor layer.

According to this arrangement, when a bonding wire is joined, it is possible to restrain the built-in resistor from being damaged by a shock, such as ultrasonic waves, or from being destroyed thereby.

Preferably, in that case, the built-in resistor is disposed below a peripheral edge of the control pad, and the wire region is formed at a middle of the control pad surrounded by the peripheral edge.

In one preferred embodiment of the present invention, a contact via that passes through the interlayer film and by which the control pad and the built-in resistor are electrically connected together.

According to this arrangement, in processing in which the position of the contact via is changed along the surface of the SiC semiconductor layer or in processing in which a via diameter is changed, it is possible to easily adjust a resistance value to which the built-in resistor contributes in a current path that leads from the outside to the transistor cells. Moreover, in these processing operations, it is only necessary to use a mask matched to distance design or to via diameter design when the contact via is formed, and therefore it is also possible to prevent the manufacturing process from becoming complicated.

In one preferred embodiment of the present invention, the plurality of built-in resistors are arranged so as to be symmetrical to each other when planarly viewed from the normal direction of the SLC semiconductor layer.

According to this arrangement, it is possible to prevent a rush current from flowing only to specific transistor cells, and therefore it is possible to reduce a variation in switching speed among the transistor cells.

Preferably, the control electrode is made of p type polysilicon for the reason that the threshold value of a SiC device is raised, and, in more detail, preferably, the control electrode includes B (boron) as a p type impurity.

B (boron)-containing polysilicon has a larger resistivity value than P (phosphorus)-containing polysilicon that is generally used in a Si semiconductor device. Therefore, boron-containing polysilicon (built-in resistor) can manage with a smaller area than phosphorus-containing polysilicon even when the same resistance value is realized. Therefore, it is possible to reduce the occupation area of the built-in resistor on the SiC semiconductor layer, and therefore it is possible to achieve the effective use of space.

A resistance value of the built-in resistor may be 2Ω to 40Ω.

A resistance value obtained by totalizing the resistance value of the control electrode and the resistance value of the built-in resistor may be 4Ω to 50Ω.

In one preferred embodiment of the present invention, sheet resistance of the built-in resistor is 10Ω/□ or more.

In practical use, if the sheet resistance of the built-in resistor is 10Ω/□ or more, it is possible to easily make the resistance value of the entire built-in resistor larger than a variation in the resistance value among a plurality of semiconductor devices without enlarging the area of the built-in resistor. As a result, it is possible to lessen the area of a region sacrificed for the built-in resistor among regions on the SiC semiconductor layer, and therefore other elements are subject to a less influence on the layout of those elements.

In one preferred embodiment of the present invention, a size of the built-in resistor is below 200 μm□ for every built-in resistor when planarly viewed from the normal direction of the SiC semiconductor layer.

In practical use, if the size of the built-in resistor is 200 μm□ or less, it is possible to reduce the area of a region sacrificed for the built-in resistor among regions of a SiC semiconductor layer, thus making it possible to realize space-saving.

In one preferred embodiment of the present invention, the built-in resistor is 2 μm or less in thickness.

It is possible to easily make the resistance value of the entire built-in resistor larger than a variation in the resistance value among a plurality of semiconductor devices by setting the thickness of the built-in resistor at 2 μm or less. On the contrary, if the built-in resistor is too thick, the built-in resistor is less-than-desirable, because its resistance value becomes too small.

In one preferred embodiment of the present invention, the semiconductor device additionally includes a finger that is disposed on a topmost surface of the semiconductor device in the same way as the control pad and that extends from the control pad so as to partition a predetermined region, and the plurality of cells are arranged in a region partitioned by the finger, and the built-in resistor connects the control pad and the finger together.

Thus, the feature of the present invention is excellently applicable also to a device having a form in which the finger extends from the control pad.

In one preferred embodiment of the present invention, the finger is made of a metal wiring. The finger is made of a metal wiring that is lower in resistance than polysilicon, and, as a result, it is possible to supply a control current to a cell that is comparatively distant from the control pad in a short time.

In one preferred embodiment of the present invention, the metal wiring Ls made of Al. Al is easily processed, and therefore it is possible to facilitate a process for forming the finger.

In one preferred embodiment of the present invention, the metal wiring is made of AlCu. According to this arrangement, this makes it possible to render power cycle tolerance higher than when the finger is an Al wiring.

In one preferred embodiment of the present invention, the metal wiring is made of Cu. According to this arrangement, it is possible to render resistivity lower than when the finger is an Al wiring or an AlCu wiring.

The cell may form a MOSFET cell, and the control pad may include a gate pad to apply a gate voltage to the MOSFET cell. In that case, the MOSFET cell may include a planar gate structure or may include a trench gate structure.

Additionally, the cell may form an IGBT cell, and the control pad may include a gate pad to apply a gate voltage to the IGBT cell.

A second semiconductor device according to the present invention includes a SiC semiconductor layer, a control pad exposed at a topmost surface for electric connection with an outside, a finger that extends from the control pad so as to partition a predetermined region and that is electrically connected to the control pad, a plurality of cells that are arranged in a region partitioned by the finger in the SiC semiconductor layer and that are subjected to ON/OFF control by means of a control voltage from the control pad, a control electrode that faces a channel region of the cells in which a channel is formed when turned on, and a built-in resistor that is disposed below the control pad and the finger and that connects the control pad and the finger together, the built-in resistor being made of a material that has a resistance value equal to or larger than the finger. In that case, the built-in resistor may be made of a metal.

A third semiconductor device according to the present invention includes a SiC semiconductor layer, a plurality of cells that are formed in the SiC semiconductor layer and that are subjected to ON/OFF control by means of a predetermined control voltage, a control electrode that faces a channel region of the cells in which a channel is formed when turned on, a control pad that is exposed at a topmost surface for electric connection with an outside and that is physically separated from the control electrode and is electrically connected to the control electrode, and a built-in resistor that is made of polysilicon electrically connecting the control pad and the control electrode together.

The aforementioned or other objects, features, and effects of the present invention will be clarified by the following description of preferred embodiments given below with reference to the accompanying drawings.

BRIEF DESCRIPTION OF DRAWINGS

FIG. 3A is a plan view, and FIG. 3B is a cross-sectional view when the semiconductor device is cut along the cutting-plane line IIIB-IIIB of FIG. 3A.

DESCRIPTION OF EMBODIMENTS

Preferred embodiments of the present invention will be hereinafter described in detail with reference to the accompanying drawings.

Figure 1:
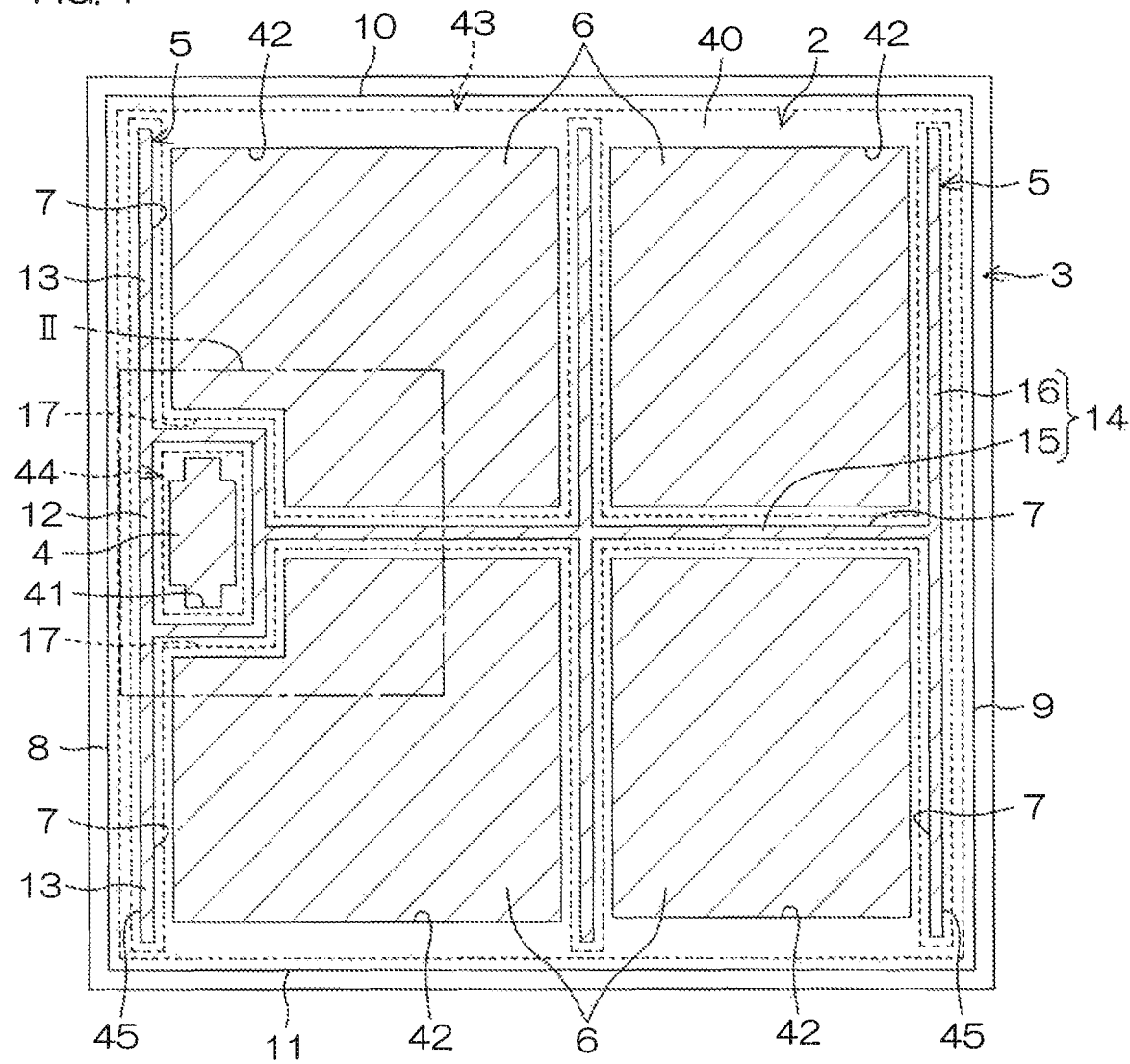
FIG. 1 is a schematic plan view of a semiconductor device according to a preferred embodiment of the present invention.

FIG. 1 is a schematic plan view of a semiconductor device 1 according to one preferred embodiment of the present invention. In FIG. 1, for clarification, some elements that are not exposed at the topmost surface of the semiconductor device 1 in being actually viewed planarly are shown by the solid line.

The semiconductor device 1 is a semiconductor device that employs SiC and that is formed in, for example, a quadrangular chip shape when its topmost surface is planarly viewed from a normal direction (hereinafter, referred to simply as "when viewed planarly").

A terminal region 3 that surrounds an active region 2 and an active region 2 is set in the semiconductor device 1. Although the active region 2 is formed in a substantially quadrangular shape when viewed planarly in an inner region of the semiconductor device 1 in the present preferred embodiment, no particular limitations are imposed on its shape. A guard ring (not shown) may be formed between the active region 2 and the terminal region 3 in order to improve the withstanding pressure of the semiconductor device 1.

A gate metal 44, a source metal 43, which are examples of a control pad of the present invention, and a gate finger 5, which is an example of a finger of the present invention, are formed in the active region 2. In such a manner as to cover these elements, a passivation film 40 is formed on the topmost surface of the semiconductor device 1. Openings 41 and 42 by which a part of the gate metal 44 and a part of the source metal 43 are exposed as a gate pad 4 and as a source pad 6, respectively, are formed in the passivation film 40. On the other hand, the gate finger 5 is wholly covered with the passivation film 40.

The gate metal 44, the gate finger 5, and the source metal 43 are made of a metal wiring such as Al (aluminum), AlCu (aluminum-copper alloy), or Cu (copper).

The gate finger 5 is made of a metal wiring that is lower in resistance than polysilicon, and, as a result, it is possible to supply a gate current to a transistor cell 18 (see FIG. 2) that is comparatively distant from the gate metal 44 (in a far position) in a short time. If Al is used, it is possible to facilitate a process for forming these wirings, because Al is excellent in processability (i.e., is tractable). On the other hand, the use of AlCu makes it possible to render power cycle tolerance higher than when Al is used, and makes it possible to improve the junction strength of a bonding wire with respect to the gate pad 4. If Cu is used, it is possible to advantageously render resistivity lower than Al and AlCu.

The gate metal 44 is selectively formed at a part of a peripheral edge of the active region 2 (near the boundary with the terminal region 3). The gate finger 5 branches and extends from the formation position of the gate pad 4 in a direction along the peripheral edge of the active region 2 and in a direction toward the inside of the active region 2. As a result, in the active region 2, cell regions 7 and 45 are formed in parts partitioned by a plurality of gate fingers 5 that extend in mutually different directions with the gate metal 44 therebetween, and are formed in a region outside the gate finger 5.

More specifically, in the present preferred embodiment, the gate metal 44 is formed in a quadrangular shape when viewed planarly, and is selectively disposed at the middle of a side 8 of the active region 2. The other sides except the side 8 (at which the gate metal 44 is disposed) of the active region 2 are a side 9, which is opposite to the side 8, and sides 10 and 11, which are each continuous with both ends of the sides 8 and 9.

The gate finger 5 includes a pad peripheral portion 12 that surrounds the periphery of the gate metal 44 with a gap therebetween and first and second fingers 13 and 14 that extend from the pad peripheral portion 12 in a direction along the side 8 of the active region 2 and in a direction perpendicular to the side 8, respectively.

The pad peripheral portion 12 is formed in a quadrangular annular shape along the periphery of the gate metal 44 when viewed planarly.

The first finger 13 is formed as a pair along the side 8 in a direction toward the side 10 and in a direction toward the side 11 opposite to the side 10 with respect to the pad peripheral portion 12.

The second finger 14 includes a linear main portion 15 that crosses the active region 2 up to the side 9 in a direction perpendicular to the first finger 13 and a plurality of branch portions 16 that are connected integrally with the main portion 15 and that extend from the connected places along the first finger 13. Although the branch portions 16 are connected to two places, i.e., to a forward end of the main portion 15 and to a halfway portion of the main portion 15 and are formed as two pairs in total in the present preferred embodiment, no particular limitations are imposed on this number.

In this way, cell regions 7 and 45 are defined by the first finger 13 and the second finger 14 (the main portion 15 and the branch portion 16) in the active region 2. In the present preferred embodiment, one inner cell region 7 is formed at each corner of the intersection portions formed by the main portion 15 and the central branch portion 16 of the second finger 14, and hence four inner cell regions 7 in total are formed. Additionally, an annular outer cell region 45 is formed along the peripheral edge of the active region 2 between the peripheral edge of the active region 2 and the gate finger 5.

The source metal 43 is formed so as to cover the inner and outer cell regions 7 and 45 substantially wholly. Four openings 42 in total are formed in the passivation film 40 such that one of the single source pads 6 is disposed in one of the inner cell regions 7.

Additionally, a concave portion 17 that follows the shape of the gate metal 44 is formed in the source metal 43. The gate metal 44 is disposed on the inward side of the active region 2 with respect to the first finger 13 in a setback manner, and hence the concave portion 17 is a hollow formed in order to avoid this gate metal 44.

Figure 2:
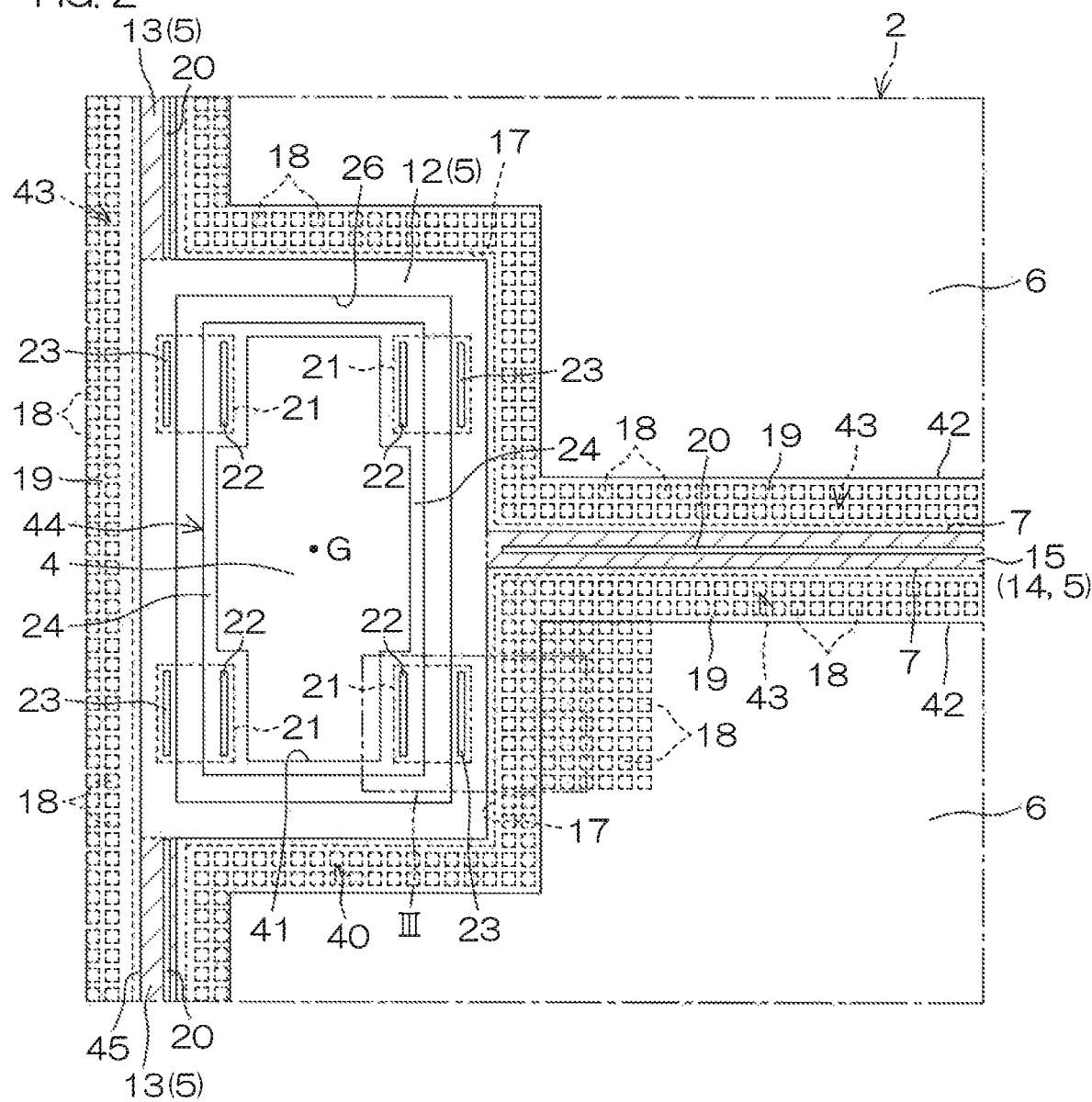
FIG. 2 is an enlarged view of a region surrounded by the alternate long and short dash line II of FIG. 1.

FIG. 2 is an enlarged view of a region surrounded by the alternate long and short dash line II of FIG. 1. In other words, FIG. 2 is a view in which the gate pad 4 of the semiconductor device 1 and a region therenear are enlarged. In FIG. 2, for clarification, some elements that are not exposed at the topmost surface of the semiconductor device 1 in being actually viewed planarly are shown by the solid line.

As shown in FIG. 2, a plurality of transistor cells 18 are arranged in the inner and outer cell regions 7 and 45 partitioned by the gate finger 5 (the pad peripheral portion 12, the first finger 13, and the second finger 14).

In the present preferred embodiment, in each of the inner and outer cell regions 7 and 45, the transistor cells 18 are arranged in a matrix manner when viewed planarly. Near the gate finger 5, the transistor cells 18 are lined up in accordance with the shape of the gate finger 5. For example, the transistor cells 18 are bent and lined up in accordance with the shape of the corner portion of the pad peripheral portion 12, and are linearly lined up in accordance with the shape of the main portion 15 of the second linear finger 14. The source metal 43 is formed so as to cover these transistor cells 18.

In FIG. 2, for clarification, only one part of the plurality of transistor cells 18 covered with the source metal 43 is shown. Additionally, the arrangement manner of the transistor cells 18 is not limited to the matrix manner, and may be, for example, a stripe manner or a zigzag manner. Still additionally, the planar shape of each of the transistor cells 18 is not limited to the quadrangular shape, and may be, for example, a circular, triangular, or hexagonal shape.

A gate electrode 19 that is an example of a control electrode of the present invention is formed between the transistor cells 18 adjoining each other. The gate electrodes 19 are each disposed between the transistor cells 18 arranged in a matrix manner in the inner and outer cell regions 7 and 45, and are formed in a grid-shaped manner as a whole when viewed planarly. On the other hand, this gate electrode 19 is formed not only in the inner and outer cell regions 7 and 45 but also in a region in which the gate finger 5 is disposed, and its parts below the gate finger 5 are brought into contact with the gate finger 5.

In the present preferred embodiment, parts of the gate electrode 19 are formed in regions below the first finger 13 and the second finger 14, and face the first finger 13 and the second finger 14 so as to serve as contact portions, respectively. In FIG. 2, for clarification, the parts of the gate electrode 19 formed in the regions therebelow are shown as those in hatched regions. As a result, the gate electrodes 19 in the mutually adjoining inner cell regions 7 are continuous with each other through the gate electrode 19 that crosses the second finger 14 therebelow. The continuous manner of the gate electrode 19 is applied to a relationship between the inner and outer cell regions 7 and 45 adjoining the gate metal 44 in the same way as above. In other words, the gate electrodes 19 in these regions are continuous with each other through the gate electrode 19 that crosses the first finger 13 therebelow.

The first finger 13 and the second finger 14 are respectively connected to the gate electrodes 19 disposed in a region therebelow by means of the gate contact 20. The gate contact 20 is formed linearly along each longitudinal direction in a finger middle with an interval from each side edge of the first and second fingers 13 and 14.

Additionally, in the present preferred embodiment, a plurality of built-in resistors 21 are disposed below the gate metal 44. Preferably, the built-in resistors 21 are arranged to be symmetric by disposing the built-in resistors 21 at positions mutually substantially equally distant from the planarly shaped gravity center position of the gate metal 44. In the present preferred embodiment, the built-in resistors 21 are disposed such that one built-in resistor 21 is provided at each corner portion of the gate metal 44 equally distant from the gravity center G of the gate metal 44 having a quadrangular shape when viewed planarly. As a result, symmetry is given to the four built-in resistors 21.

The pattern of this symmetry is variously designable, and, for example, two built-in resistors 21 may be disposed at two corner portions, respectively, of the gate metal 44 that have an opposite-corner relationship, or two built-in resistors 21 may be disposed at two sides, respectively, of the gate metal 44 that have an opposite-side relationship so as to face each other. Additionally, for example, if the gate metal 44 is circular when viewed planarly, two built-in resistors 21 may be disposed at both ends, respectively, of the diameter of the gate metal 44, and if the gate metal 44 is triangular when viewed planarly, three built-in resistors 21 may be disposed at three corner portions, respectively, of the gate metal 44.

Each built-in resistor 21 is formed so as to cross and straddle an annular gap region 26 between the gate metal 44 and the gate finger 5 (pad peripheral portion 12). As a result, the built-in resistor 21 faces both the gate metal 44 and the gate finger 5. The gate metal 44 and the gate finger 5 (pad peripheral portion 12) are each connected to the built-in resistor 21 disposed in a region therebelow by means of a pad-side contact 22 and a cell-side contact 23 each of which is an example of a contact via of the present invention.

Figure 3:
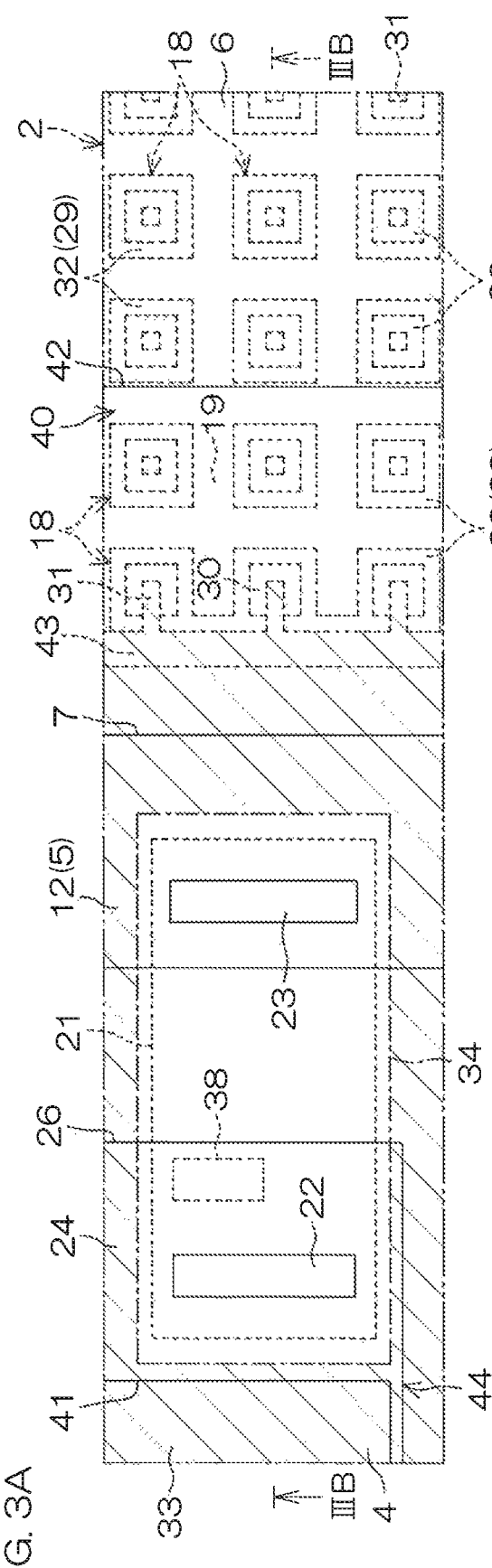
FIG. 3A and FIG. 3B are enlarged views of a region surrounded by the alternate long and two short dashes line III of FIG. 2.

In the present preferred embodiment, four built-in resistors 21 extend from below each peripheral edge 24 of two sides of the gate metal 44 that have an opposite-side relationship in the outside direction perpendicular to these sides, and reach a part below the pad peripheral portion 12. Each built-in resistor 21 is formed in a quadrangular shape when viewed planarly, and has a size of, for example, 200 μm☐ (200 μm×200 μm) or less. In practical use, if the size of the built-in resistor 21 is 200 μm☐ or less for every built-in resistor, it is possible to reduce the area of a region sacrificed for the built-in resistor among regions of a SiC epitaxial layer 28 (see FIG. 3B), thus making it possible to realize space-saving.

Additionally, the pad-side contact 22 and the cell-side contact 23 are each formed in a linear shape parallel to each other along the side of the gate metal 44 and the side of the pad peripheral portion 12.

The built-in resistor 21 is disposed below the peripheral edge 24 of the gate metal 44 excluding the middle thereof, and a region above the region in which the built-in resistor 21 is disposed is covered with the passivation film 40, and, as a result, the gate pad 4 serving as a wire region of the present invention surrounded by the built-in resistors 21 is secured at the middle of the gate metal 44. The gate pad 4 is a region to which a bonding wire is connected.

In other words, in the present preferred embodiment, each corner portion of the gate metal 44 at which the built-in resistor 21 is disposed is selectively covered with the passivation film 40, and the other parts of the gate metal 44 are exposed from the opening 41. As a result, the gate pad 4, which has a quadrangular shape when viewed planarly and which has corner portions each of which is concaved inwardly, is exposed at the topmost surface of the semiconductor device 1. A region above the region in which the built-in resistor 21 is disposed is covered with the passivation film 40 in this way, and therefore when a bonding wire is joined, it is possible to prevent the bonding wire from being erroneously joined to a part that overlaps with the built-in resistor 21 in the gate metal 44. As a result, when a bonding wire is joined, it is possible to restrain the built-in resistor 21 from being damaged by a shock, such as ultrasonic waves, or from being destroyed thereby.

FIG. 3A and FIG. 3B are enlarged views of a region surrounded by the alternate long and two short dashes line III of FIG. 2, and FIG. 3A is a plan view, and FIG. 3B is a cross-sectional view when the semiconductor device 1 is cut by the cutting-plane line IIIB-IIIB of FIG. 3A. In FIG. 3A and FIG. 3B, for clarification, there is a case in which the reduced scale of each component differs from that in FIG. 1 and that in FIG. 2, and, likewise, there is a case in which the reduced scale of each component differs between FIG. 3A and FIG. 3B. Additionally, in FIG. 3A and FIG. 3B, for clarification, some elements that are not exposed at the topmost surface of the semiconductor device 1 when actually viewed planarly are shown by the solid line.

Next, a more detailed arrangement of the built-in resistor 21 and a neighboring region thereof will be described along with a cross-sectional structure of the semiconductor device 1.

The semiconductor device 1 includes a SiC substrate 27 and a SiC epitaxial layer 28. The SiC epitaxial layer 28 is stacked on the SiC substrate 27, and this layered structure is shown as an example of the SiC semiconductor layer of the present invention.

The SiC substrate 27 and the SiC epitaxial layer 28 are n$^+$ type SiC and n$^-$ type SiC, respectively. The impurity concentration of the n$^+$ type SiC substrate 27 is, for example, $1 \times 10^{17}$ cm$^{-3}$ to $1 \times 10^{21}$ cm$^{-3}$. On the other hand, the impurity concentration of the n$^-$ type SiC epitaxial layer 28 is, for example, $1 \times 10^{14}$ cm$^{-3}$ to $1 \times 10^{17}$ cm$^{-3}$. For example, N (nitrogen), P (phosphorus), As (arsenic), etc., can be used as n type impurities (hereinafter, same as above).

In the inner cell region 7, a plurality of transistor cells 18 are formed on a surface portion of the SiC epitaxial layer 28. The transistor cells 18 include a p$^-$ type body region 29, an n$^+$ type source region 30 selectively formed in the inner region with an interval from the peripheral edge of the p$^-$ type body region 29, and a p$^+$ type body contact region 31 selectively formed in the inner region with an interval from the peripheral edge of the n$^+$ type source region 30. The n$^-$ type part of the SiC epitaxial layer 28 serves as a shared drain region among the transistor cells 18.

As shown in FIG. 3A, an n$^+$ type source region 30 is formed so as to surround the p$^+$ type body contact region 31 except the transistor cells 18 along the pad peripheral portion 12 (gate finger 5) when viewed planarly, and, furthermore, a p$^-$ type body region 29 is formed so as to surround the n$^+$ type source region 30. In the p$^-$ type body region 29, an annular region that surrounds the n$^+$ type source region 30 is a channel region 32 in which a channel is formed when the semiconductor device 1 is brought into an ON state. The transistor cells 18 of the outer cell region 45 are arranged in the same way although those are not shown in FIG. 3A and FIG. 3B.

On the other hand, in the transistor cells 18 along the pad peripheral portion 12 (gate finger 5), the p$^-$ type body region 29 and the p$^+$ type body contact region 31 are electrically connected to a p$^-$ type region 34 and a p$^+$ type region 33 described below, respectively.

The impurity concentration of the p$^-$ type body region 29 is, for example, $1 \times 10^{14}$ cm$^{-3}$ to $1 \times 10^{19}$ cm$^{-3}$, and the impurity concentration of the n$^+$ type source region 30 is, for example, $1 \times 10^{17}$ cm$^{-3}$ to $1 \times 10^{21}$ cm$^{-3}$, and the impurity concentration of the p$^+$ type body contact region 31 is, for example, $1 \times 10^{19}$ cm$^{-3}$ to $1 \times 10^{21}$ cm$^{-3}$.

In order to form these regions 29 to 31, the p$^-$ type body region 29 is formed by ion implantation, for example, into the surface portion of the SiC epitaxial layer 28. Thereafter, the n$^+$ type source region 30 and the p$^+$ type body contact region 31 are formed by applying the ion implantation of n type impurities and p type impurities, in this order, into a surface portion of the p$^-$ type body region 29. As a result, the transistor cells 18 composed of regions 29 to 31 are formed. For example, B (boron), Al (aluminum), etc., can be used as p type impurities (hereinafter, same as above).

A p$^-$ type region 34 is formed in the surface portion of the SiC epitaxial layer 28 in regions other than the inner and outer cell regions 7 and 45 in the active region 2, i.e., in regions below the gate metal 44, the gate finger 5, and the gap region 26. A p$^+$ type region 33 is formed in a surface portion of the p$^-$ type region 34.

The p$^+$ type region 33 is formed in the substantially whole area of regions below the gate metal 44 etc., so as to selectively expose the p$^-$ type part of the p$^-$ type region 34 at the SiC surface in a region of the SiC epitaxial layer 28 facing the built-in resistor 21 and so as to selectively expose its own p$^+$ type part at the SiC surface in regions other than that region of the SiC epitaxial layer 28. In other words, the gate metal 44 and the gate finger 5 face the p$^-$ type part in a region in which the built-in resistor 21 is disposed, and face the p$^+$ type part in most regions other than the region in which the built-in resistor 21 is disposed. The p⁺ type region 33 and the p⁻ type region 34 are each formed so as to extend to below the source metal 43, and are connected integrally with the p⁺ type body contact region 31 and the p⁻ type body region 29 below the source metal 43 (in the present preferred embodiment, in parts outside the source pad 6), respectively. In FIG. 3A, the p⁺ type body contact region 31 and the p⁺ type region 33 of the transistor cells 18 along the pad peripheral portion 12 (gate finger 5) are shown as hatched regions. In practical use, the p⁺ type body contact region 31 is fixed at ground potential along with the source metal 43, so that the p⁺ type region 33 becomes 0 V and is stabilized. Therefore, it is preferable to allow most parts of the gate metal 44 and the gate finger 5 to face the p⁺ type region 33 as in the present preferred embodiment.

The p⁺ type region 33 and the p⁻ type region 34 are each formed through the same process as the p+ type body contact region 31 and the p– type body region 29 respectively, and its impurity concentration and its depth are also the same.

A gate insulating film 35 that is an example of an insulating film of the present invention is formed on the surface of the SiC epitaxial layer 28. The gate insulating film 35 is made of an insulating material, such as silicon oxide, and is, for example, 0.001 µm to 1 µm in thickness. The gate insulating film 35 is a shared insulating film to insulate the gate electrode 19 and the built-in resistor 21 from the SiC epitaxial layer 28.

The gate electrode 19 and the built-in resistor 21 are formed on the gate insulating film 35. The gate electrode 19 is formed so as to face the channel region 32 of each transistor cell 18 with the gate insulating film 35 therebetween. On the other hand, the built-in resistor 21 is formed so as to face the exposed p⁻ type part of the p⁻ type region 34 with the gate insulating film 35 therebetween.

Both the gate electrode 19 and the built-in resistor 21 are made of p type polysilicon, and may be formed through the same process. In the present preferred embodiment, the gate electrode 19 and the built-in resistor 21 include B (boron) as a p type impurity. B (boron)-containing polysilicon has a larger resistivity value than P (phosphorus)-containing polysilicon that is generally used in a Si semiconductor device. Therefore, boron-containing polysilicon (built-in resistor 21) can manage with a smaller area than phosphorus-containing polysilicon even when the same resistance value is realized. Therefore, it is possible to reduce the occupation area of the built-in resistor 21 on the SiC epitaxial layer 28, and therefore it is possible to achieve the effective use of space.

The concentration of p type impurities included in polysilicon is appropriately changeable in accordance with the design resistance value of the gate electrode 19 and the design resistance value of the built-in resistor 21, respectively. This concentration is set so that the sheet resistance of the built-in resistor 21 is 10Ω/□ or more in the present preferred embodiment. In practical use, if the sheet resistance of the built-in resistor 21 is 10Ω/□ or more, it is possible to easily make the resistance value of the entire built-in resistor 21 larger than a variation in the resistance value among a plurality of semiconductor devices 1 without enlarging the area of the built-in resistor 21. For example, if a variation in the resistance value is 0.1Ω to 20Ω, it is possible to set the resistance value of the built-in resistor 21 at 2Ω to 40Ω in a state in which the area is small. As a result, it is possible to lessen the area of a region sacrificed for the built-in resistor 21 among regions on the SiC epitaxial layer 28, and therefore other elements are subject to a less influence on the layout of those elements. Preferably, in this case, a resistance value obtained by totalizing the resistance value of the gate electrode 19 and the resistance value of the built-in resistor 21 is 4Ω to 50Ω.

Preferably, the gate electrode 19 and the built-in resistor 21 are 2 µm or less in thickness. It is possible to easily make the resistance value of the entire built-in resistor 21 larger than a variation in the resistance value among a plurality of semiconductor devices 1 by setting the thickness of the built-in resistor 21 at 2 µm or less. On the contrary, if the built-in resistor 21 is too thick, the built-in resistor 21 is less-than-desirable, because its resistance value becomes too small.

An interlayer film 36 is formed on the gate insulating film 35 so as to cover the gate electrode 19 and the built-in resistor 21. The interlayer film 36 is made of an insulating material, such as silicon oxide, and is, for example, 0.1 µm to 5 µm in thickness.

Additionally, the interlayer film 36 is formed so as to enter a region (first region) in which the gate electrode 19 and the built-in resistor 21 are not disposed among the regions on the gate insulating film 35. This makes it possible to enlarge a distance between the SiC epitaxial layer 28 and the gate metal 44 (i.e., the thickness T of the insulating film) in the region in which the built-in resistor 21 is not disposed, and hence makes it possible to reduce the capacity therebetween.

The pad-side contact 22 and the cell-side contact 23 are formed so as to pass through the interlayer film 36. The pad-side contact 22 and the cell-side contact 23 are each made of a metal via formed integrally with the gate metal 44 and the gate finger 5 (pad peripheral portion 12).

A source contact 46 to take contact from the source metal 43 with respect to the n⁺ type source region 31 and the p⁺ type body contact region 31 is formed so as to pass through the interlayer film 36. The source contact 46 is made of a metal via formed integrally with the source metal 43.

The gate metal 44, the gate finger 5, and the source metal 43 are formed and spaced out on the interlayer film 36.

Then, the passivation film 40 is formed on the interlayer film 36 so as to cover the gate metal 44, the gate finger 5, and the source metal 43. The openings 41 and 42 by which parts of the gate metal 44 and the source metal 43 are exposed are formed in the passivation film 40.

As described above, according to the semiconductor device 1, a polysilicon resistance (built-in resistor 21) is interposed between the gate metal 44 and the gate finger 5 (pad peripheral portion 12) as shown in FIG. 3A and FIG. 3B. In other words, the built-in resistor 21 is interposed in the halfway place of a current path that leads from the outside to the transistor cells 18.

In a resistance value (gate resistance) obtained by totalizing the resistance value of the gate electrode 19 and the resistance value of the built-in resistor 21, it is possible to make the resistance value of the built-in resistor 21 dominant by adjusting the resistance value of the built-in resistor 21. Therefore, even when a plurality of semiconductor devices 1 among which a variation exists in the resistance value of the gate electrode 19 are used by being connected in parallel with each other, the resistance value of the built-in resistor 21 is set to be larger than this variation, thus making it possible to limit the flow of an electric current into a semiconductor device 1 in which the resistance value of the gate electrode 19 is relatively low. As a result, it is possible to reduce the occurrence of a noise when the semiconductor devices 1 are used.

Moreover, polysilicon of which the built-in resistor 21 is made is a material in which the resistance value can be easily controlled by, for example, the implantation of impurities, and its processing has been established by a conventional semiconductor manufacturing technique. Therefore, when the built-in resistor 21 is introduced, it is also possible to avoid the complication of the structure of the semiconductor device 1 itself and of the structure of a module provided with this semiconductor device 1.

The built-in resistor 21 is smaller in processing size than the gate electrode 19 although there is a case in which a variation in dimension and thickness is caused by a variation in processing accuracy (etching size etc.) when a semiconductor device 1 is manufactured as in the same way as in the gate electrode 19. Therefore, in the built-in resistor 21, such a variation hardly causes the occurrence of a noise.

Additionally, the built-in resistor 21 is connected to the gate metal 44 below the gate metal 44, and therefore it is possible to limit the flow-in of a gate current at an entrance portion of a current path that leads from the outside to the transistor cells 18. This makes it possible to prevent a rush current from flowing only to specific transistor cells 18.

For example, in FIG. 2, let it be supposed that the built-in resistor 21 is formed at a halfway portion of the first finger 13 or of the second finger 14 of the gate finger 5 as a detour of the finger 13 or 14. In this case, there is a case in which a rush current flows from the fingers 13 and 14 to the gate electrode 19 through the gate contact 20 on the side closer to the gate metal 44 than the built-in resistor 21 before reaching the built-in resistor 21. On the other hand, if a gate current can be limited at an entrance portion of a current path as in the present preferred embodiment, it is possible to reduce a variation in switching speed among the transistor cells 18.

Additionally, the built-in resistors 21 are symmetrically disposed as shown in FIG. 2. This feature also makes it possible to reduce a variation in switching speed among the transistor cells 18.

Additionally, in the SiC epitaxial layer 28, a region facing the built-in resistor 21 is the p⁻ type region 34 that has an impurity concentration of $1\times10^{19}$ cm$^{-3}$ or less as shown in FIG. 3A and FIG. 3B. Therefore, it is possible to excellently restrain the insulation breakdown of the gate insulating film 35. Additionally, it is more difficult for the p⁻ type region to store carriers than for the n type region, and therefore it is also possible to reduce the capacity between the built-in resistor 21 and the p⁻ type region 34 both of which face each other with the gate insulating film 35 therebetween.

Additionally, as shown in FIG. 3A and FIG. 3B, the gate metal 44 and the built-in resistor 21 are connected together by means of the pad-side contact 22 made of a metal via. Therefore, in processing in which the position of the pad-side contact 22 is changed along the surface of the SIC epitaxial layer 28 or in processing in which a via diameter is changed, it is possible to easily adjust a resistance value to which the built-in resistor 21 contributes in a current path that leads from the outside to the transistor cells 18.

It is possible to easily shorten the distance from the contact position with respect to the built-in resistor 21 to the pad peripheral portion 12 so as to be changed from D1 to D2, for example, merely by bringing it closer to the pad peripheral portion 12 than the pad-side contact 22 like the pad-side contact 37 shown by the broken line in FIG. 3B. This makes it possible to lessen the resistance value of the built-in resistor 21. On the contrary, it is possible to enlarge the resistance value of the built-in resistor 21 by distancing it from the pad peripheral portion 12. Additionally, it is possible to enlarge the resistance value of a current path to the built-in resistor 21 merely by making the via diameter smaller than the pad-side contact 22 like the pad-side contact 38 shown by the broken line in FIG. 3A. On the contrary, it is possible to lessen the resistance value of the path by making the via diameter larger.

Moreover, in these processing operations, it is only necessary to use a mask matched to distance design or to via diameter design when the pad-side contact 22 (via) is formed, and therefore it is also possible to prevent the manufacturing process from becoming complicated.

Although the preferred embodiment of the present invention has been described as above, the present invention can be embodied in other modes.

Figure 4:
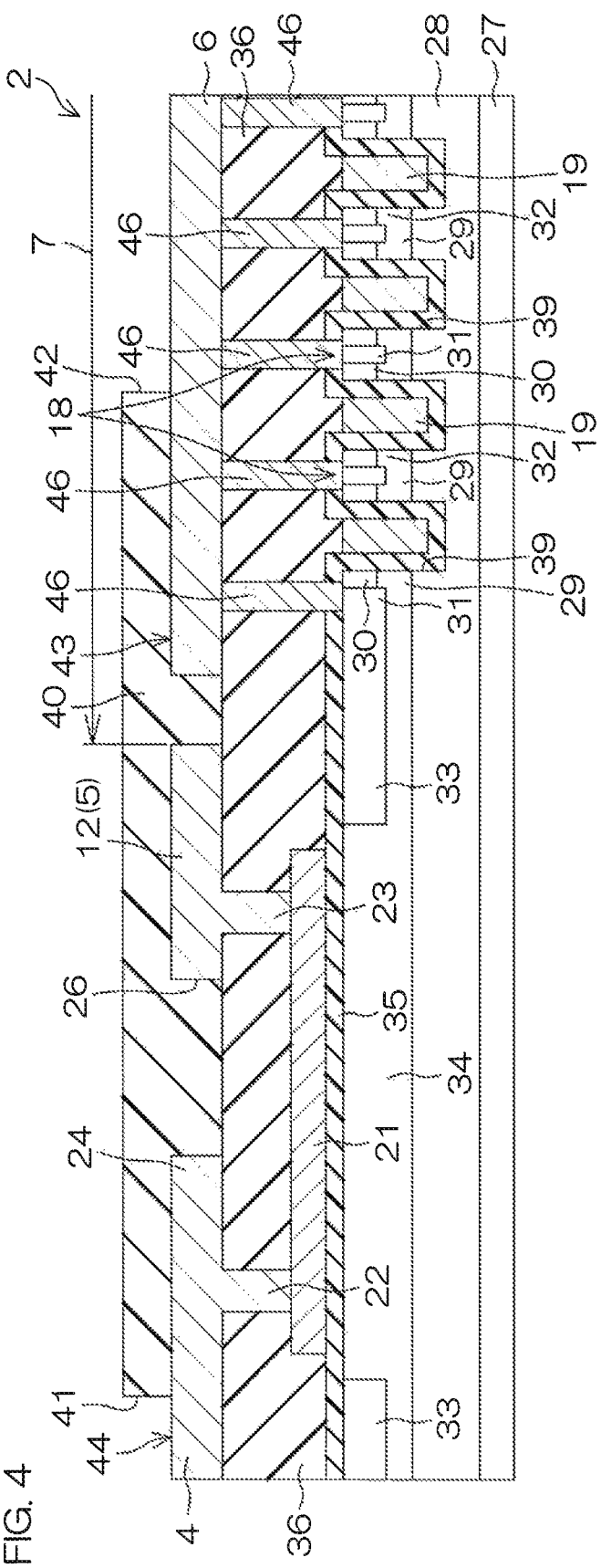
FIG. 4 is a view showing a modification of a cell structure.

For example, although the transistor cell 18 is a MOSFET cell having a planar gate structure as described in the aforementioned preferred embodiment, the transistor cell 18 may be a MOSFET cell having a trench gate structure as shown in FIG. 4. In this case, the gate electrode 19 is buried in agate trench 39 formed between the transistor cells 18 through the gate insulating film 35.

Additionally, the transistor cell 18 may be an IGBT cell having a planar gate structure or a trench gate structure. In this case, it is recommended to use a p⁺ type SiC substrate 27 instead of the n⁺ type SiC substrate 27.

Additionally, the built-in resistor 21 is not required to be embedded in the interlayer film 36 below the gate metal 44, and, for example, a polysilicon wiring by which the gate metal 44 and the gate finger 5 are connected together may be formed on the surface of the interlayer film 36 so as to serve as a built-in resistor of the present invention.

Additionally, instead of polysilicon, a material having a resistance value that is equal to or larger than that of the gate metal 44 and that of the gate finger 5 (for example, a metal wiring of Al (aluminum), AlCu (aluminum-copper alloy), Cu (copper), etc.) may be used as a material of the built-in resistor 21. Even if the built-in resistor 21 is a metal, it is possible to lengthen the distance between the gate metal 44 and the gate finger 5, and therefore it is possible to enlarge a resistance value obtained by totalizing the resistance value of the gate electrode 19 and the resistance value of the built-in resistor 21.

Additionally, the built-in resistor 21 is not required to be formed below the gate metal 44, and may be formed below, for example, the gate finger 5.

Additionally, the built-in resistor 21 may be linear along a part of the peripheral edge 24 of the gate metal 44, or may be annular along the entire periphery of the peripheral edge 24 of the gate metal 44.

Additionally, an arrangement in which the conductivity type of each semiconductor part of the aforementioned semiconductor device 1 is reversed may be employed. For example, in the semiconductor device 1, the p type part may be an n type, and the n type part may be a p type.

Figure 5:
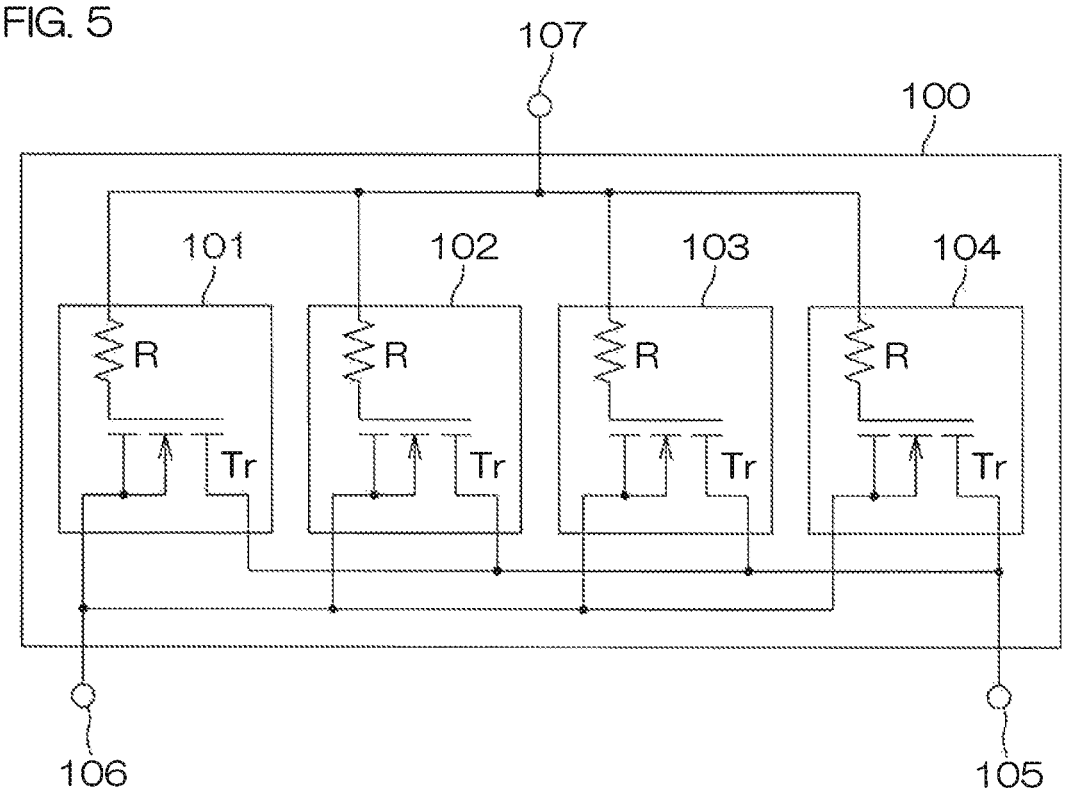
FIG. 5 is an electric circuit diagram showing an electric circuit of a module to which the semiconductor device according to one preferred embodiment of the present invention is applied.

FIG. 5 is an electric circuit diagram showing an electric circuit of a module to which the semiconductor device according to one preferred embodiment of the present invention is applied.

A module 100 includes a plurality of semiconductor devices (chips) 101 to 104, a drain terminal 105, a source terminal 106, and a gate terminal 107. Each semiconductor device 101 to 104 is formed of the semiconductor device 1 shown in FIG. 1 to FIG. 3. Each semiconductor device 101 to 104 may be formed of the semiconductor device shown in FIG. 4. The semiconductor devices 101 to 104 are connected together in parallel.

Each semiconductor device 101 to 104 includes a plurality of transistor cells 18 (see FIG. 2, FIG. 3A, and FIG. 3B) connected together in parallel and four built-in resistors 41 (see FIG. 2, FIG. 3A, and FIG. 3B) connected together in parallel. In FIG. 5, the transistor cells 18 connected together in parallel are represented as one transistor cell Tr, and the four built-in resistors 41 connected together in parallel are represented as one resistor R.

The gate electrode of each semiconductor device 101 to 104 is connected to the gate terminal 107 of the module 100 through the built-in resistor R contained therein. The drain electrode of each semiconductor device 101 to 104 is connected to the drain terminal 105 of the module 100. The source electrode of each semiconductor device 101 to 104 is connected to the source terminal 106 of the module 100.

In this module 100, a built-in resistor R having a resistance value that is larger than the gate resistance in each semiconductor device 101 to 104 is contained in each semiconductor device 101 to 104. Therefore, in this module 100, the structure of the module becomes simpler than when an external gate resistance having a resistance value larger than the gate resistance in each semiconductor device 101 to 104 is provided in each semiconductor device 101 to 104.

Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2013-246474 filed in the Japan Patent Office on Nov. 28, 2013, and the entire disclosure of the application is incorporated herein by reference.

REFERENCE SIGNS LIST

1 Semiconductor device
2 Active region
4 Gate pad
5 Gate finger
7 Inner cell region
12 Pad peripheral portion
13 First finger
14 Second finger
15 Main portion
16 Branch portion
18 Transistor cell
19 Gate electrode
20 Gate contact
21 Built-in resistor
22 Pad-side contact
23 Cell-side contact
24 Peripheral edge
27 SiC substrate
28 SiC epitaxial layer
29 $P^-$ type body region
30 $N^+$ type body region
31 $P^+$ type body contact region
32 Channel region
33 $P^+$ type region
34 $P^-$ type region
35 Gate insulating film
36 Interlayer film
37 Pad-side contact
38 Pad-side contact
39 Gate trench
44 Gate metal

The invention claimed is:

1. A semiconductor device comprising:
a semiconductor layer;
a plurality of cells that are formed in the semiconductor layer;
a control pad for electric connection for controlling the semiconductor device,
a pad peripheral portion formed around the control pad to surround the control pad continuously;
a built-in resistor that is disposed partly below the control pad and that is made of polysilicon, the built-in resistor electrically connecting the control pad with the pad peripheral portion; and
a plurality of source pads for electric connection,
wherein the control pad is isolated from the pad peripheral portion physically in a same layer so that a space is formed between the control pad and the pad peripheral portion, and the control pad is formed around the edge portion of the semiconductor device,
a connecting portion to which a connecting member is connected is selectively formed on a surface of the control pad, and
the built-in resistor is selectively disposed in a region that avoids the connecting portion in a plain view.

2. The semiconductor device according to claim 1, wherein the connection portion occupies more than half of the area of the control pad in a plan view.

3. The semiconductor device according to claim 1, further comprising a gate finger extending from the peripheral portion of the pad.

4. The semiconductor device according to claim 3, wherein the gate finger extends in three directions from the peripheral portion of the control pad.

5. The semiconductor device according to claim 4, wherein the gate finger has portions extending to the four corners of the semiconductor device.

6. The semiconductor device according to claim 5, wherein a width of the gate finger is narrower than a width of the built-in resistor.

7. The semiconductor device according to claim 1, wherein the built-in resistor has a rectangular shape in a plan view.

8. The semiconductor device according to claim 1, wherein the control pad is made of a material containing aluminum.

9. The semiconductor device according to claim 8, wherein the pad peripheral portion is made of a material containing aluminum.

10. The semiconductor device according to claim 9, further comprising a plurality of source pads for electric connection,
wherein each of said source pads are made of a material containing aluminum.

11. The semiconductor device according to claim 1, wherein semiconductor device has a rectangular shape in a plan view, and
the control pad is provided in the vicinity of the center of one side of the semiconductor device in a plan view.

12. The semiconductor device according to claim 1, wherein the peripheral portion of the pad has the same thickness as the control pad.

13. The semiconductor device according to claim 1, wherein the built-in resistor is disposed in a region partially below the control pad with an interlayer film selectively disposed between the built-in resistor and the control pad.

14. The semiconductor device according to claim 1, wherein the connection portion is formed in a central portion of the control pad.

15. The semiconductor device according to claim 1, wherein at least a part of the built-in resistor is disposed in a lower region of the control pad.

16. A semiconductor device comprising:
a semiconductor layer;
a plurality of cells that are formed in the semiconductor layer;
a control pad for electric connection for controlling the semiconductor device,
a pad peripheral portion formed around the control pad to surround the control pad continuously;
a built-in resistor that is disposed partly below the control pad and that is made of polysilicon, the built-in resistor connecting the control pad with the pad peripheral portion; and
a plurality of source pads for electric connection,
wherein the control pad is isolated from the pad peripheral portion physically in a same layer so that a space is formed between the control pad and the pad peripheral portion, and the control pad is formed around the edge portion of the semiconductor device,
a connecting portion to which a connecting member is connected is selectively formed on a surface of the control pad, and
the built-in resistor is selectively disposed in a region that avoids the connecting portion in a plain view.

17. The semiconductor device according to claim 16, wherein the connection portion occupies more than half of the area of the control pad in a plan view.

18. The semiconductor device according to claim 16, further comprising a gate finger extending from the peripheral portion of the pad.

19. The semiconductor device according to claim 18, wherein the gate finger extends in three directions from the peripheral portion of the control pad.

20. The semiconductor device according to claim 19, wherein the gate finger has portions extending to the four corners of the semiconductor device.

* * * * *